US011249219B2

(12) United States Patent
Mohsenian et al.

(10) Patent No.: US 11,249,219 B2
(45) Date of Patent: Feb. 15, 2022

(54) GLOBAL SURFACE PALEO-TEMPERATURE MODELING TOOL

(71) Applicant: Landmark Graphics Corporation, Houston, TX (US)

(72) Inventors: Elham Mohsenian, Houston, TX (US); Andrew Davies, West Hagbourne Oxon (GB); Afshin Fathi Mobarakabad, Houston, TX (US)

(73) Assignee: Landmark Graphics Corporation, Houston, TX (US)

( * ) Notice: Subject to any disclaimer, the term of this patent is extended or adjusted under 35 U.S.C. 154(b) by 224 days.

(21) Appl. No.: 16/340,491

(22) PCT Filed: Dec. 29, 2016

(86) PCT No.: PCT/US2016/069183
§ 371 (c)(1),
(2) Date: Apr. 9, 2019

(87) PCT Pub. No.: WO2018/125133
PCT Pub. Date: Jul. 5, 2018

(65) Prior Publication Data
US 2019/0310392 A1   Oct. 10, 2019

(51) Int. Cl.
*G01V 99/00*       (2009.01)
*G06F 30/20*       (2020.01)

(52) U.S. Cl.
CPC .......... *G01V 99/005* (2013.01); *G06F 30/20* (2020.01)

(58) Field of Classification Search
CPC .............................. G01V 99/005; G06F 30/20
See application file for complete search history.

(56) References Cited

U.S. PATENT DOCUMENTS

2015/0066461 A1   3/2015   Kacewicz
2015/0242362 A1   8/2015   Wiik et al.
(Continued)

FOREIGN PATENT DOCUMENTS

EP     2778725 B1 *   3/2014   ............ G01V 99/00
EP     2778725 A2     9/2014
WO     2018125133 A1  7/2018

OTHER PUBLICATIONS

"Yao Tong et al., Constraining basin thermal history and petroleum generation using palaeoclimate data in the Piceance Basin, Colorado," Basin Research (2017) vol. 29, Issue 4, First Published: Aug. 5, 2016, https://onlinelibrary.wiley.com/doi/full/10.1111/bre.12213 (Year: 2016).*

(Continued)

*Primary Examiner* — Tarun Sinha
*Assistant Examiner* — Lal C Mang
(74) *Attorney, Agent, or Firm* — Tenley Krueger; Parker Justiss, P.C.

(57) ABSTRACT

A method, a tool, and a system for modeling sediment surface paleo-temperature are provided. The method includes: determining a latitudinal temperature gradient of a location for a time period in the geologic past based on a depositional environment of the location during the time period; determining a surface temperature of the location during the time period using the latitudinal temperature gradient and a latitude of the location during the time period; and modifying the surface temperature at the location during the time period based on an altitude of the location during the time period.

21 Claims, 3 Drawing Sheets

(56) References Cited

U.S. PATENT DOCUMENTS

2016/0077228 A1    3/2016  Hokstad
2017/0177764 A1*  6/2017  Guy ........................ E21B 49/00

OTHER PUBLICATIONS

Wygrala, B. P., "Integrated Study of an Oil Field in the Southern Po Basin, Northern Italy," Ph.D. Dissertation, 7 pages, Oct. 1989, http://juser/fz-juelich.de/record/153416, see sections 7.2.5-7.2.6 and figures 7-6 and 7-7.
Al-Hajeri, M. M., et al., "Basin and Petroleum System Modeling," Oilfield Review 21, No. 2, Summer 2009, pp. 14-29, http://www.slb.com/~/media/Files/resources/oilfield_review/ors09,sum09/basin_petroleum.pdf.
Tong, Y., et al., "Constraining Basin Thermal History and Petroleum Generation Using Palaeoclimate Data in Piceance Basin, Colorado," European Associates of Geoscientists & Engineers and International Association of Sedimentologists, pp. 542-553, Sep. 14, 2016.

* cited by examiner

GLOBAL SURFACE PALEO-TEMPERATURE MODELING TOOL

CROSS-REFERENCE TO RELATED APPLICATION

This application is the National Stage of, and therefore claims the benefit of, International Application No. PCT/US2016/069183 filed on Dec. 29, 2016, entitled "GLOBAL SURFACE PALEO-TEMPERATURE MODELING TOOL," which was published in English under International Publication Number WO 2018/125133 on Jul. 5, 2018, and has a priority date of. The above application is commonly assigned with this National Stage application and is incorporated herein by reference in its entirety.

BACKGROUND

To maximize the return on investment, petroleum companies thoroughly assess their investment risk before drilling petroleum exploration wells. One of the important tools, if not the most important tool, in such an assessment is basin and petroleum system modeling. Basin and petroleum modeling examines the dynamics of sedimentary basins and the fluids within them to determine if past conditions were suitable for the generation of hydrocarbons. One of the most important constraints in petroleum system modeling is sediment surface temperature. Sediment surface temperature affects the source rock maturity and the volume of hydrocarbon generated.

BRIEF DESCRIPTION

Reference is now made to the following descriptions taken in conjunction with the accompanying drawings, in which.

DETAILED DESCRIPTION

As mentioned above, sediment surface temperature is one of the most important constraints in petroleum system modeling since it directly affects the source rock maturity and the volume of hydrocarbon generated. Traditional methods of calculating sediment surface temperature, however, do not accurately calculate the sediment surface temperature because they overlook factors, such as, realistic changes in the latitudinal temperature gradient due to global temperature change and the effect of changing depositional environments. Accordingly, it is desired to have methods and apparatuses that take into account those traditionally overlooked factors to accurately determine a sediment surface temperature of a location through time.

The introduced methods and apparatuses recognize that the temperature at the earth's surface varies depending on latitude and whether the location is on land or on water. As such, unlike the traditional methods, the introduced methods and apparatuses consider two different latitudinal temperature profiles, for land and ocean, when determining a surface temperature.

The introduced methods and apparatuses also recognize, unlike the traditional methods, that no simple equation can be used to account for temperature changes related to changes in water depth or elevation. As such, the introduced method and apparatus can account for changes in water depth and elevation according to the results from various climate model simulations.

The introduced methods and apparatuses also recognize, unlike the traditional methods, that the changes in mean global temperatures cannot be applied evenly across all latitudes to reflect reality. As such, the introduced method and apparatus can apply the latitudinal changes in mean global temperature according to the results from various climate model simulations.

Furthermore, unlike the traditional methods that monitor latitudinal changes of a rather broad location, e.g. an entire state of New Mexico, the introduced methods and apparatuses can significantly refine the monitoring range to a specific location, e.g., a location of a well, using a detailed plate tectonic model.

In sum, the introduced methods and apparatuses allow sediment surface paleo-temperatures to be calculated in both the ocean and on land as a function of time and latitude, with corrections for water depth, elevation and latitudinal temperature gradients through time. Accordingly, the introduced methods and apparatuses provides a robust way to model sediment surface temperature variations and hence, a more accurate way to model petroleum system. With these accurately modeled petroleum system models, petroleum companies can better identify new drilling opportunities and also better understand the involved exploration risks.

Figure 1:
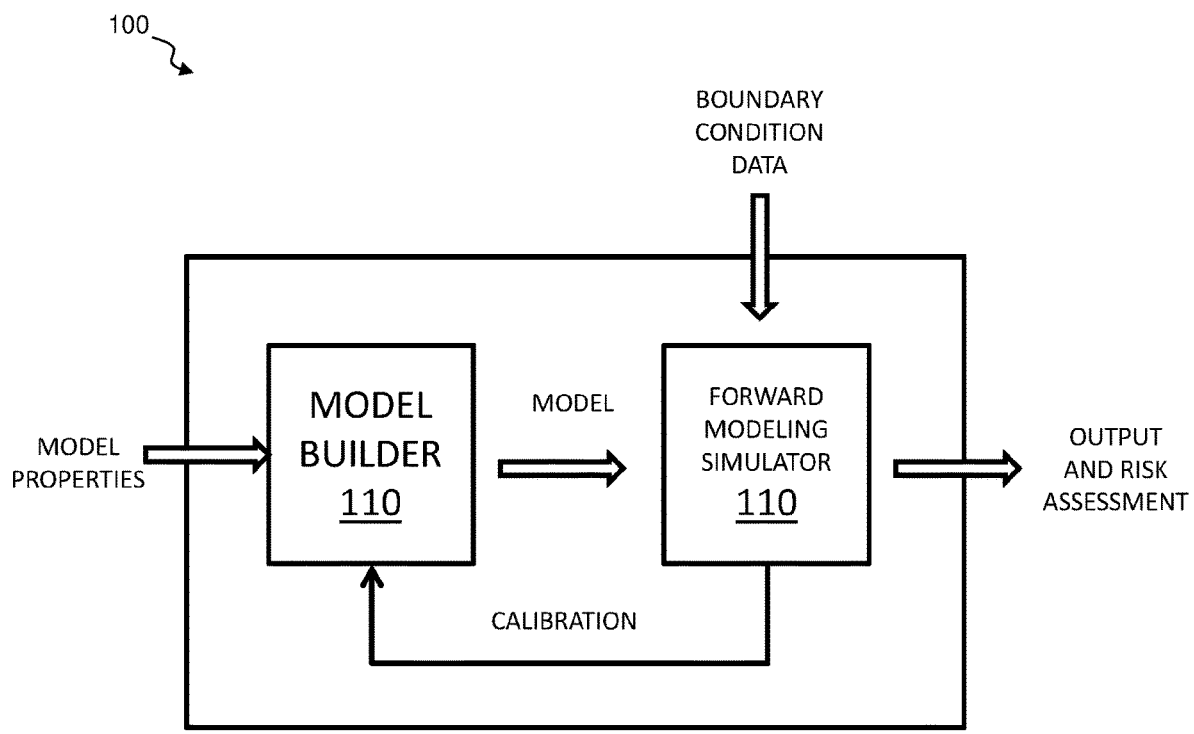
FIG. 1 illustrates a block diagram of a basin/petroleum modelling system.

FIG. 1 illustrates a basin and petroleum modeling system 100. System 100 includes a model builder 110 and a forward modeling simulator 120. Model builder 110 is configured to construct a model of an area of interest, such as a potential well location, on which simulations can be performed. As such, the model builder 110 receives various model properties, such as ages and physical properties of all layers for building the model.

Once the structural model is built using the model properties, the forward modeling simulator 120 performs various simulations, e.g. a heat-flow simulation, on the model to evaluate specific past conditions of the area. For these simulations, the forward modeling simulator 120 receives boundary condition data such as paleobathymetry and sediment/water interface temperatures throughout the geologic time. Results of the simulations are compared with independent measurements to refine/calibrate the model.

Figure 2:
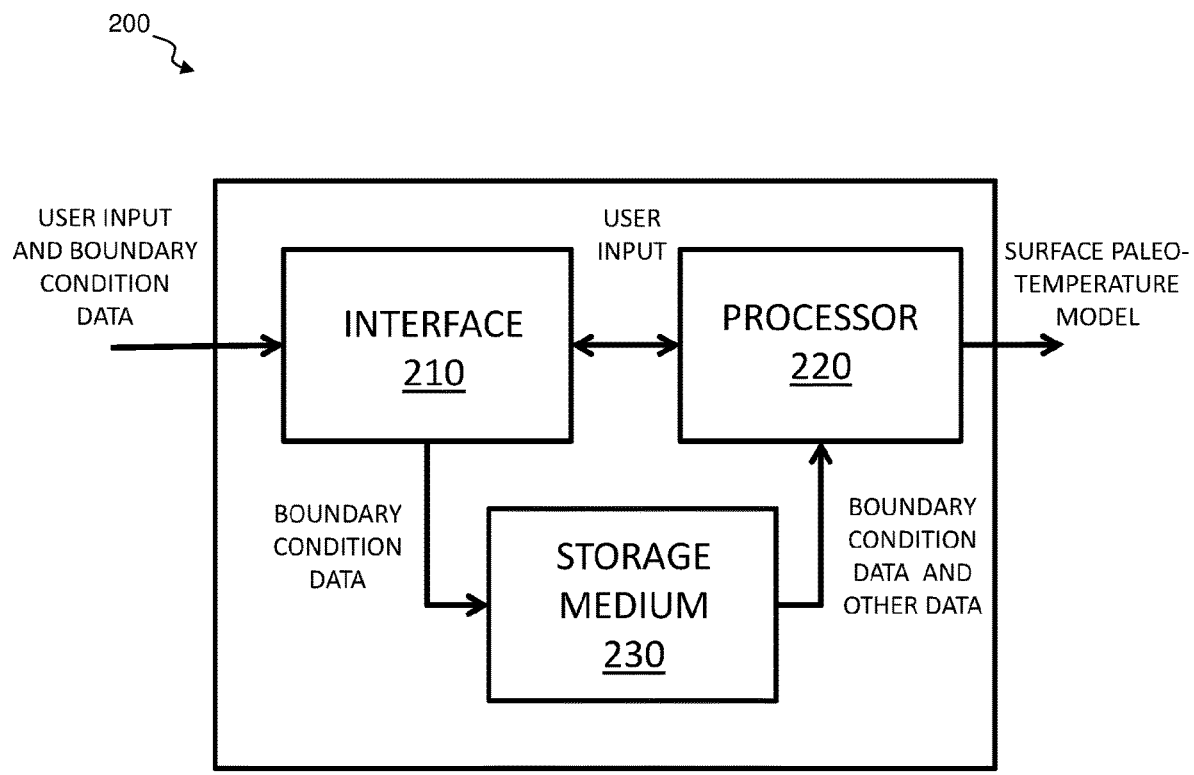
FIG. 2 illustrates a block diagram of a tool for modelling surface paleo-temperature.

FIG. 2 illustrates a tool 200 for modeling sediment surface paleo-temperature. Tool 200 includes an interface 210, a processor 220 and a non-transient storage medium 230. Interface 210, the processor 220 and the memory 230 can be connected together via conventional means. Although illustrated as a single stand-alone unit, the tool 200 may be implemented as a part of a forward modeling simulator in a basin/petroleum modelling system such as the forward modeling simulator 120 in FIG. 1, and also as multiple processing units distributed across a network.

Interface 210 is configured to receive user input and boundary condition data that are needed in modelling surface paleo-temperature. Interface 210 can be a conventional interface that is used to receive and transmit data. Interface 210 may forward the boundary data to the processor 220 for processing or to the storage medium 230 for storage. Interface 210 can include multiple ports, terminals or connectors for receiving or transmitting the data. The ports, terminals or connectors may be conventional receptacles for communicating data via a communications network.

Processor 220 is configured to determine sediment surface temperatures of a location for a given time period in the geologic past using the user input and the boundary condition data. Processor 220 is further configured to produce a curve using the determined sediment surface temperatures as a surface paleo-temperature model. For example, the processor 220 can determine the sediment surface temperatures of the location for a given time period according to the methods illustrated in FIG. 3. Although located in the tool 200 in FIG. 2, the processor 220 may be located outside the tool 200 and be a part of a main processing unit of a forward modeling simulator such as the forward modeling simulator 120.

Figure 3:
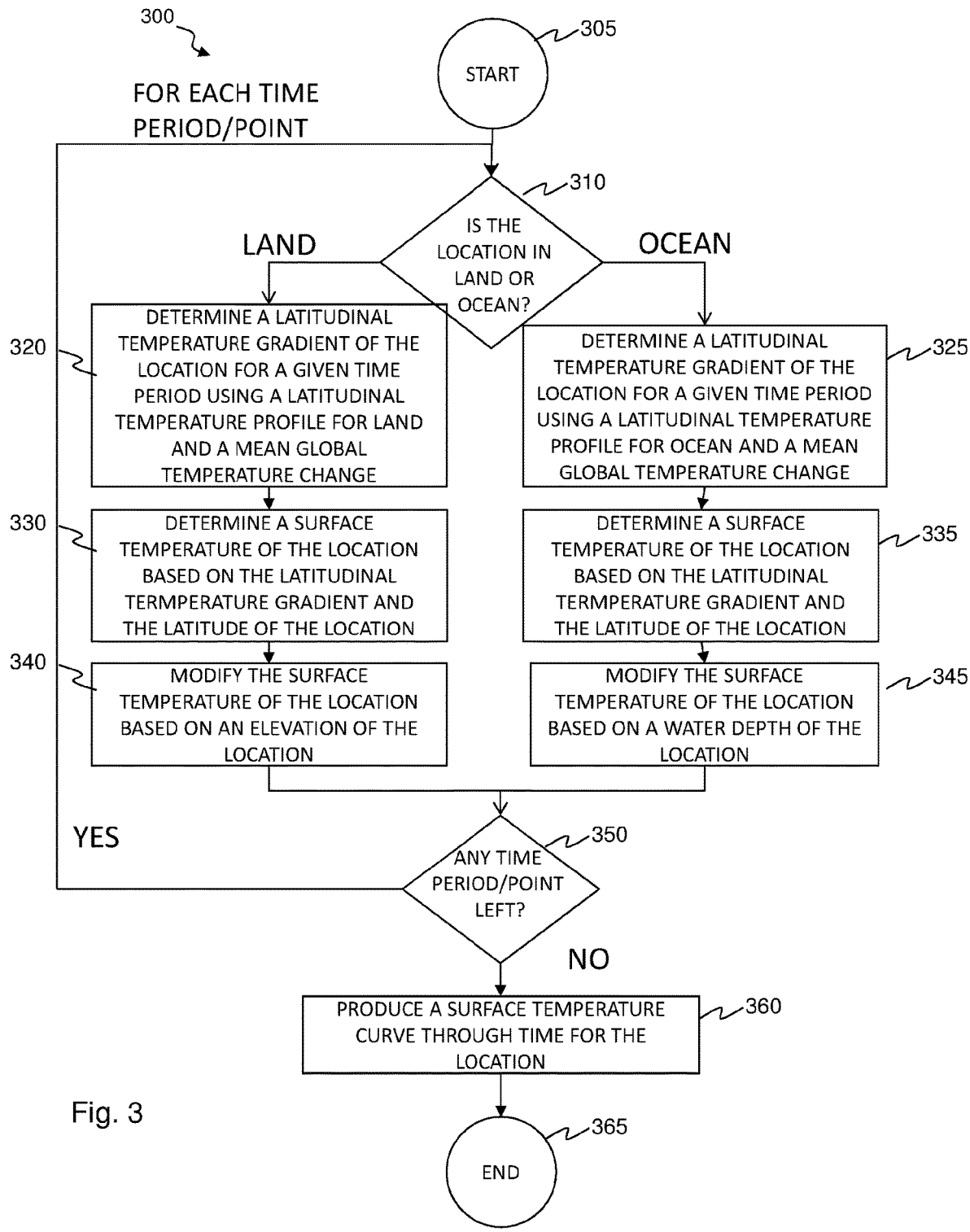
FIG. 3 illustrates a flow diagram of a method for modelling surface paleo-temperature.

Non-transient computer-readable storage medium 230 stores a computer program product that, when executed by the processor 220, can cause the processor 220 to determine the sediment surface temperatures of the location for a given time period in the geologic past, such as illustrated in FIG. 3. Non-transient storage medium 230 can be a memory that stores operating instructions to direct the operation of the processor 220 when initiated thereby. The operating instructions may correspond to algorithms that provide the functionality of the modeling schemes disclosed herein. For example, the operating instructions may correspond to the algorithm or algorithms that implement the methods illustrated in FIG. 3.

In addition to the computer program product/operating instructions, the storage medium 230 may also store the boundary condition data and other data that are needed in determining the sediment surface temperatures such as latitudinal data from a global tectonic model, latitudinal temperature profiles for both ocean and land, and altitude data (referenced from sea level) such as paleo-elevation and paleo-water depth data.

Non-transient computer-readable storage medium 230 refers to all computer-readable media except for transitory, propagating signals. Examples of the computer-readable medium include, but are not limited to: magnetic media such as hard disks, floppy disks, and magnetic tape; optical media such as CD-ROM disks; magneto-optical media such as floptical disks; and hardware devices that are specially configured to store and execute program code, such as ROM and RAM devices. Examples of program code include both machine code, such as produced by a compiler, and files containing higher level code that may be executed by the computer using an interpreter.

FIG. 3 illustrates a method 300 for modelling sediment surface paleo-temperature of a location, e.g. sediment surface temperatures of a well location through a time period in the geologic past. Method 300 may be carried out by a sediment surface paleo-temperature modeling tool such as the modeling tool 200 in FIG. 2 or a forward modeling simulator such as the forward modeling simulator 120 in FIG. 1. Method 300 can be repeated until sediment surface temperatures of the well location for all the time periods of interest are determined. As each time period corresponds to a specific data point in time, each time period may be referred to as each time point. The length of all the time periods/points may span up to 595 million years with each time period being at least one million years.

Method 300 starts at step 305. At step 310, the method 300 determines a latitude and a depositional environment ("DE") of the location during a given time period/point. The latitude may be determined using a global tectonic model such as, one owned by Halliburton Energy Services, Inc. of Houston, Tex.

The DE of the location may be defined by a user as either "land" or "ocean" based on the location's proximity to land and ocean. In some instances where the location's proximity to land and ocean is similar, e.g. on the coast or shoreline, "ocean" is selected as a default. Method 300 may also determine the DE of the location "automatically" (without the user input) using data from global paleogeographic maps.

If the DE of the location for the given time period/point is "land", the method 300 determines a latitudinal temperature gradient of the location for the given time period/point using a latitudinal temperature profile of land at step 320. Also at step 320, the method 300 adjusts the determined latitudinal temperature gradient by applying a mean global temperature change.

Unlike the traditional method that applies the mean global temperature change evenly across all latitudes, the method 300 uses climate model simulations to determine how the change is distributed to the latitude of the location. This is based on the recognition that the mean global temperature changes apply differently to different latitudes, e.g. a temperature increase near the poles is greater than a temperature increase near the equator.

For example, the method 300 may determine how a change in the mean global temperature for a given time period/a specific climate state, e.g. +4° C. at 20 Ma (Million years ago) affect different latitudinal temperature gradients by extrapolating/interpolating the respective latitudinal temperature gradient from conventional climate model simulations, e.g. global climate model/general circulation model simulations, for different time periods/points. Fourier transform-based techniques may be used in the interpolation/extrapolation.

At step 330, using the adjusted latitudinal temperature gradient and the latitude of the location, the method 300 determines a surface temperature of the location for the given time period/point. At step 340, the surface temperature of the location is modified based on an elevation of the location to accurately determine a sediment surface temperature of the location. The elevation of the location refers to the height of the location's surface from sea level. The elevation of the location may be determined "automatically" (without the user input) using data from global paleogeographic maps, with Fourier extrapolation from the model constraint. The elevation may also be received as an input from the user if detailed data constraint for the location is available.

Returning to the step 310, if the DE of the location of the given time period/point is "ocean", the method 300 determines a latitudinal temperature gradient of the location for the given time period/point using a latitudinal temperature profile of ocean at step 325. The latitudinal temperature profile of ocean is a collection of annual mean values that are averaged over a 30 year period/point and binned for each latitude.

Similar to the latitudinal temperature gradient of land, the latitudinal temperature gradient of ocean for the given time period/point is adjusted based on the mean global temperature change and constrained using the climate model simulations.

At step 335, the method 300 determines a surface temperature of the location based on the adjusted latitudinal temperature gradient and the latitude of the location. At step 345, the surface temperature of the location is modified based on a water depth of the location to accurately determine a sediment surface temperature of the location under the water. The water depth can be referenced from sea level.

The water depth may be determined "automatically" (without the user input) using data from global paleogeographic maps, with Fourier extrapolation from the model constraint, or it may be received from the user if, for example, detailed data constraint for the location is available.

Turning now to step 350 from either step 340 or 345, the method 300 determines if it has gone through all the time periods/points. If not, the method 300 reverts to step 310 for the remaining time periods/points.

When the method 300 determines that it has gone through all the time periods/points, the method 300 proceeds to step 360. At step 360, the method 300 maps all the determined sediment surface temperatures and produces a curve showing sediment surface temperatures of the location through all the time periods/points of interest. The curve can be provided to a display for viewing. The curve can be used by a basin/petroleum modeling system, such as the system 100 in FIG. 1, in a simulation, e.g. a heat flow simulation, during petroleum system modeling, to evaluate specific past conditions of the location. Once the risks involved in exploring are thoroughly assessed using these past conditions for the location, petroleum companies may decide to undergo drilling a test/exploration well in the location to confirm the presence of hydrocarbon in the location. The method 300 ends at step 365.

Those skilled in the art to which this application relates will appreciate that other and further additions, deletions, substitutions and modifications may be made to the described embodiments.

The above-described system, apparatus, and methods or at least a portion thereof may be embodied in or performed by various processors, such as digital data processors or computers, wherein the computers are programmed or store executable programs of sequences of software instructions to perform one or more of the steps of the methods. The software instructions of such programs may represent algorithms and be encoded in machine-executable form on non-transitory digital data storage media, e.g., magnetic or optical disks, random-access memory (RAM), magnetic hard disks, flash memories, and/or read-only memory (ROM), to enable various types of digital data processors or computers to perform one, multiple or all of the steps of one or more of the above-described methods or functions of the system or apparatus described herein.

Certain embodiments disclosed herein can further relate to computer storage products with a non-transitory computer-readable medium that have program code thereon for performing various computer-implemented operations that embody the apparatuses, the systems or carry out the steps of the methods set forth herein.

Embodiments Disclosed Herein Include

A. A method for modeling sediment surface paleo-temperature, comprising determining a latitudinal temperature gradient of a location for a time period in the geologic past based on a depositional environment of the location during the time period, determining a surface temperature of the location during the time period using the latitudinal temperature gradient and a latitude of the location during the time period, and modifying the surface temperature of the location during the time period based on an altitude of the location during the time period.

B. A sediment surface paleo-temperature modeling tool, comprising a processor and a non-transient storage medium having a computer program product stored therein, the computer program product, when executed, causing the processor to determine a latitudinal temperature gradient of a location for a time period in the geologic past based on a depositional environment of the location during the time period, determine a surface temperature of the location during the time period using the latitudinal temperature gradient and a latitude of the location during the time period, and modify the surface temperature of the location during the time period based on an altitude of the location during the time period.

C. A system for modeling a basin and petroleum system, comprising a forward modeling simulator including a processor, the processor configured to determine a latitudinal temperature gradient of a location for a time period based on a depositional environment of the location during the time period, determine a surface temperature of the location during the time period using the latitudinal temperature gradient and a latitude of the location during the time period, and modify the surface temperature of the location during the time period based on an altitude of the location during the time period.

Each of embodiments A, B, and C may have one or more of the following additional elements in combination:

Element 1: refining the latitude of the location during the time period using a plate tectonic model. Element 2: wherein the latitudinal temperature gradient is determined using a latitudinal temperature profile of ocean when the depositional environment of the location is ocean. Element 3: wherein the latitudinal temperature gradient is determined using a latitudinal temperature profile of land when the depositional environment of the location is land. Element 4: applying a correction to the latitudinal temperature gradient using a mean global temperature change and climate model simulations. Element 5: wherein modifying the surface temperature based on the altitude includes modifying the surface temperature based on a water-depth of the location during the time period when the depositional environment of the location is ocean. Element 6: wherein modifying the surface temperature based on the altitude includes modifying the surface temperature based on an elevation of the location during the time period when the depositional environment of the location is land. Element 7: mapping the surface temperature of the location for the time period. Element 8: wherein the computer program product, when executed, further causes the processor to refine the latitude of the location during the time period using a plate tectonic model. Element 9: wherein the computer program product, when executed, further causes the processor to apply a correction to the latitudinal temperature gradient using a mean global temperature change and climate model simulations. Element 10: wherein the computer program product, when executed, further causes the processor to map the surface temperature of the location for the time period. Element 11: wherein the processor is further configured to refine the latitude of the location during the time period using a plate tectonic model. Element 12: wherein the processor is further configured to apply a correction to the latitudinal temperature gradient using a mean global temperature change and climate model simulations. Element 13: wherein the processor is further configured to map the surface temperature of the location for the time period.

What is claimed is:

1. A method for modeling sediment surface paleo-temperature comprising:
   determining a latitudinal temperature gradient of a location for a time period in the geologic past based on a depositional environment of said location during said time period, wherein said depositional environment indicates whether a latitudinal temperature profile of land or a latitudinal temperature profile of ocean is used for said determining;

adjusting said latitudinal temperature gradient of said location for said time period, wherein said adjusting includes applying a mean global temperature change for said time period to said latitudinal temperature gradient based on a latitude of said location for said time period;

determining a surface temperature of said location during said time period using said latitudinal temperature gradient and said latitude of said location during said time period;

modifying said surface temperature of said location during said time period based on an altitude of said location during said time period; and mapping said surface temperature of said location for said time period to produce a curve for petroleum modeling.

2. The method of claim 1 further comprising refining said latitude of said location during said time period using a plate tectonic model.

3. The method of claim 1, wherein said latitudinal temperature gradient is determined using said latitudinal temperature profile of ocean when said depositional environment of said location is ocean.

4. The method of claim 1, wherein said latitudinal temperature gradient is determined using said latitudinal temperature profile of land when said depositional environment of said location is land.

5. The method of claim 1, wherein said applying includes determining how said mean global temperature change is distributed to said latitude of said location using climate model simulations.

6. The method of claim 1, wherein said modifying said surface temperature based on said altitude includes modifying said surface temperature based on a water-depth of said location during said time period when said depositional environment of said location is ocean.

7. The method of claim 1, wherein said modifying said surface temperature based on said altitude includes modifying said surface temperature based on an elevation of said location during said time period when said depositional environment of said location is land.

8. A sediment surface paleo-temperature modeling tool comprising:

a processor; and a non-transient storage medium having a computer program product stored therein, said computer program product, when executed, causing said processor to:

determine a latitudinal temperature gradient of a location for a time period in the geologic past based on a depositional environment of said location during said time period, wherein said depositional environment indicates whether a latitudinal temperature profile of land or a latitudinal temperature profile of ocean is used to determine said latitudinal temperature gradient;

adjust said latitudinal temperature gradient of said location for said time period by applying a mean global temperature change for said time period to said latitudinal temperature gradient based on a latitude of said location for said time period;

determine a surface temperature of said location during said time period using said latitudinal temperature gradient and said latitude of said location during said time period;

modify said surface temperature of said location during said time period based on an altitude of said location during said time period; and map said surface temperature of said location for said time period to produce a curve for petroleum modeling.

9. The modeling tool of claim 8, wherein said computer program product, when executed, further causes said processor to refine said latitude of said location during said time period using a plate tectonic model.

10. The modeling tool of claim 8, wherein said latitudinal temperature gradient is determined using said latitudinal temperature profile of ocean when said depositional environment of said location is ocean.

11. The modeling tool of claim 8, wherein said latitudinal temperature gradient is determined using said latitudinal temperature profile of land when said depositional environment of said location is land.

12. The modeling tool of claim 9, wherein said applying includes determining how said mean global temperature change is distributed to said latitude of said location using climate model simulations.

13. The modeling tool of claim 8, wherein said surface temperature is modified based on a water-depth of said location during said time period when said depositional environment of said location is ocean.

14. The modeling tool of claim 8, wherein said surface temperature is modified based on an elevation of said location during said time period when said depositional environment of said location is land.

15. A system for modeling a basin and petroleum system comprising:

a forward modeling simulator including a processor, wherein said processor:

determines a latitudinal temperature gradient of a location for a time period based on a depositional environment of said location during said time period, wherein said depositional environment indicates whether a latitudinal temperature profile of land or a latitudinal temperature profile of ocean is used to determine said latitudinal temperature gradient;

adjusts said latitudinal temperature gradient of said location for said time period by applying a mean global temperature change for said time period to said latitudinal temperature gradient based on a latitude of said location for said time period;

determines a surface temperature of said location during said time period using said latitudinal temperature gradient and said latitude of said location during said time period;

modifies said surface temperature of said location during said time period based on an altitude of said location during said time period; and maps said surface temperature of said location for said time period to produce a curve for petroleum modeling.

16. The system of claim 15, wherein said processor refines said latitude of said location during said time period using a plate tectonic model.

17. The system of claim 15, wherein said latitudinal temperature gradient is determined using said latitudinal temperature profile of ocean when said depositional environment of said location is ocean.

18. The system of claim 15, wherein said latitudinal temperature gradient is determined using said latitudinal temperature profile of land when said depositional environment of said location is land.

19. The system of claim 15, wherein said applying includes determining how said mean global temperature change is distributed to said latitude of said location using climate model simulations.

20. The system of claim 15, wherein said surface temperature is modified based on a water-depth of said location during said time period when said depositional environment of said location is ocean.

21. The system of claim 15, wherein said surface temperature is modified based on an elevation of said location during said time period when said depositional environment of said location is land.

* * * * *